United States Patent
Natarajan

(12) 
(10) Patent No.: US 6,388,592 B1
(45) Date of Patent: May 14, 2002

(54) USING SIMULATED PSEUDO DATA TO SPEED UP STATISTICAL PREDICTIVE MODELING FROM MASSIVE DATA SETS

(75) Inventor: Ramesh Natarajan, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/761,589

(22) Filed: Jan. 18, 2001

(51) Int. Cl.$^7$ .............................................. H03M 7/00
(52) U.S. Cl. ......................................... 341/107; 706/45
(58) Field of Search ............................ 341/50, 51, 107; 706/45

(56) References Cited

U.S. PATENT DOCUMENTS 6,182,058 B1 * 1/2001 Kohavi ........................ 706/45

* cited by examiner

Primary Examiner—Brian Young
(74) Attorney, Agent, or Firm—Whitham, Curtis & Christofferson, P.C.; Stephen C. Kaufman

(57) ABSTRACT

The computational cost of many statistical modeling algorithms is affected by the input/output (I/O) cost of accessing out-of-core training data. This is an important challenge for emerging data mining applications, where the amount of training data can be potentially enormous. A heuristic approach to this problem is described. This approach is based on constructing a simple probability model from the large training data set, and using this model to generate simulated pseudo data for some aspects of the statistical modeling procedure. This approach is illustrated in the context of building a Naive Bayes probability model with feature selection. Here, the usual algorithms would require numerous data scans over the massive training data set, but our heuristic obtains models of comparable accuracy with just two data scans.

7 Claims, 6 Drawing Sheets

US 6,388,592 B1

USING SIMULATED PSEUDO DATA TO SPEED UP STATISTICAL PREDICTIVE MODELING FROM MASSIVE DATA SETS

BACKGROUND OF THE INVENTION

1. Field of the Invention

The present invention generally relates to a method for building statistical predictive models from massive data sets in a computationally tractable way and, more particularly, to an efficient heuristic approach that uses a simple probability model obtained from the massive training data set to generate simulated pseudo data for most aspects of the overall predictive modeling procedure. This heuristic approach reduces the number of expensive data scans over the massive training data set and, consequently, leads to a significant reduction in the computational cost without greatly affecting the overall accuracy of the statistical modeling procedure.

2. Background Description

Predictive modeling techniques are of central importance in applications such as database marketing, targeted advertising, fraud detection, credit/risk modeling, and information retrieval. In all these applications, the training data sets can be potentially enormous. For example, certain marketing databases that we have encountered contain millions of customer records with thousands of attributes per record. The development of statistical predictive modeling algorithms is of central importance in these applications. However, the computational cost of existing statistical procedures is prohibitively expensive for the massive data sets that are encountered therein.

Therefore, typically in these applications, the computational cost is reduced by using preliminary data reduction prior to the statistical modeling procedure. For example, consider a data set with N records and J features per record, where N, M are large. Sub-sampling can be used to select some N'<<N records, and a preliminary feature selection or transformation can be used to select some J'<<J features. This reduced data set with N' records and J' features is then used to perform the required statistical modeling in a computationally tractable way. However, sub-sampling is unsatisfactory for heterogenous and high-dimensional data sets, and the resulting model estimates will have a high degree of variability with respect to the sampling. Similarly, the preliminary feature selection or transformation is unsatisfactory since it may inadvertently exclude or de-emphasize the original features that are crucial for the accuracy of the eventual statistical models.

Other techniques have recently emerged for scaling up statistical modeling algorithms to massive data sets. For example, G. Graefe, U. Fayyad and S. Chaudhuri, "On the Efficient Gathering of Sufficient Statistics for Classification from Large SQL Databases", *Proc. of the Fourth International Conference on Knowledge Discovery and Data Mining*, pp. 204–208, (1998), and A. W. Moore and M. S. Lee, "Cached Sufficient Statistics for Efficient Machine Learning with Large Datasets", *Journal of Artificial Intelligence Research*, p. 8 (1998), describe efficient methods for evaluating the sufficient statistics for specific statistical modeling algorithms, which allows the modeling computations to be carried without having to refer back to the original data. These approaches work well if the statistical modeling algorithm is fixed in advance, and if it has a a finite set of sufficient statistics that can be easily obtained from the data. However, one or the other of these assumptions may not be true in many predictive modeling situations.

Other approaches to this problem include P. S. Bradley, U. Payyad and C. Reina, "Scaling Clustering Algorithms to Large Databases", *Proc. of the Fourth International Conference on Knowledge Discovery and Data Mining*, pp. 9–15, (1998), and W. DuMouchel, C. Volinsky, T.Johnson, C. Cortes and D. Pregibon, "Squashing Flat Files Flatter", *Proc. of the Fifth International Conference on Knowledge Discovery and Data Mining*, pp. 6–15, (1999) who describe methods for producing compressed data sets consisting of a small number of pseudo data points and associated weights. These compressed data sets are used to evaluate statistical models that are more accurate and less variable than that from an equivalent-sized, randomly sub-sampled subset of the original data. However, these approaches require that existing predictive modeling algorithms and computer codes be capable of handling weights for the data points, which is a limitation.

SUMMARY OF THE INVENTION

According to our invention, we provide a heuristic approach that leads to a computationally efficient way for statistical predictive modeling from massive data sets.

This approach is based on constructing a simple probability model from the data, and using this model to generate simulated pseudo data that can be used for some aspects of the statistical modeling procedure. For example, this could be used for preliminary model selection or model parameter estimation. The preliminary model can then be refined in a final step by reverting to the original training data. This reduces the number of data scans over the massive training data set, and thereby reduces the computational cost of the overall statistical modeling procedure.

In order to illustrate this approach, we consider the specific problem of a Naive Bayes model with feature selection. This is a widely used predictive modeling technique in the machine learning community for multi-variate categorical response variables. A straightforward feature selection algorithm would require $O(J^2)$ data scans over the training data in order to find the Naive Bayes model with the optimum feature subset. However, our heuristic approach uses just two data scans to obtain models of comparable accuracy.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Notation

Figure 1:
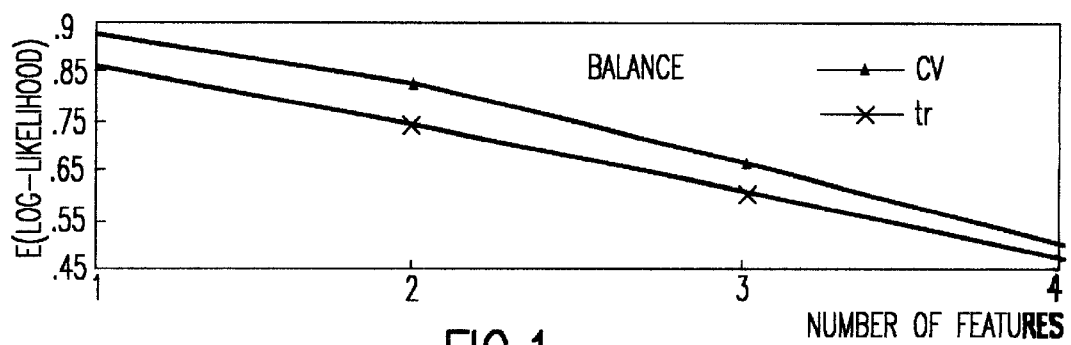
FIG. 1 is a graph of the empirical negative log-likelihood estimates for Naive B ayes models of increasing feature set cardinality obtained using penalized BIC (tr) and 10-fold cross-validation (cv) for the balance data set from Table 1.
Figure 2:
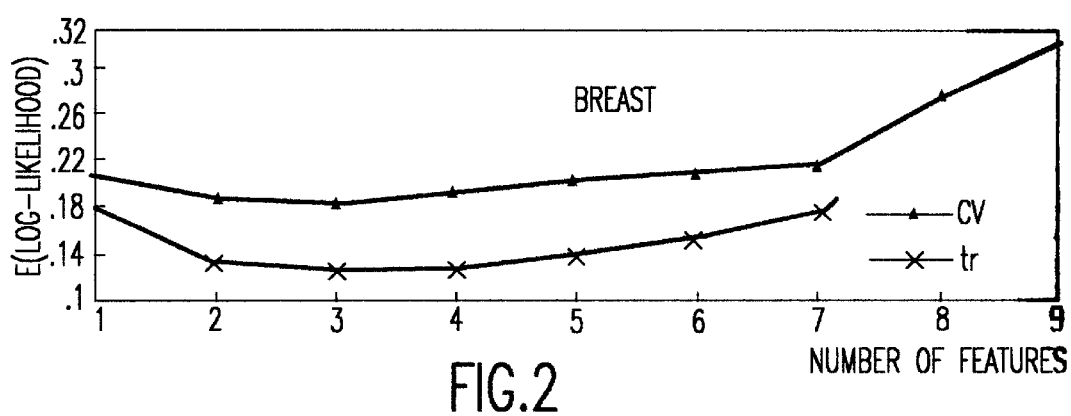
FIG. 2 is a graph of the empirical negative log-likelihood estimates for Naive Bayes models of increasing feature set cardinality obtained using penalized BIC (tr) and 10-fold cross-validation (cv) for the breast data set from Table 1.
Figure 3:
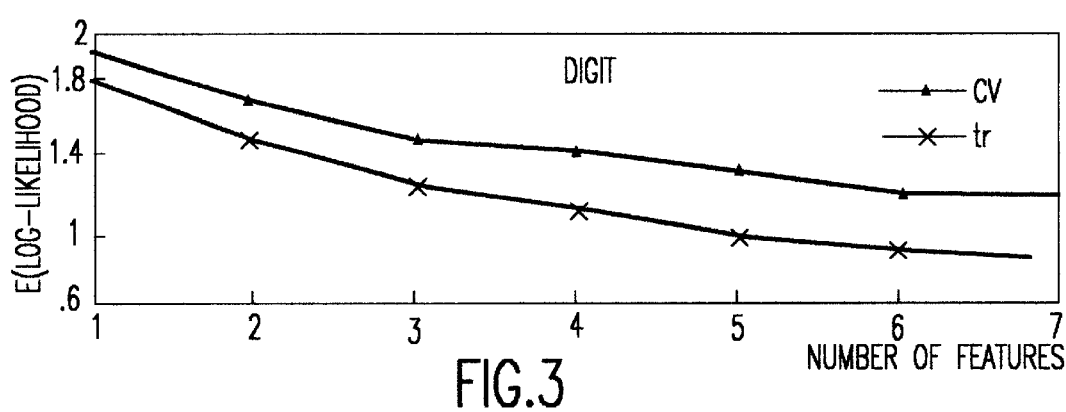
FIG. 3 is a graph of the empirical negative log-likelihood estimates for Naive Bayes models of increasing feature set cardinality obtained using penalized BIC (tr) and 10-fold cross-validation (cv) for the digit data set from Table 1.
Figure 4:
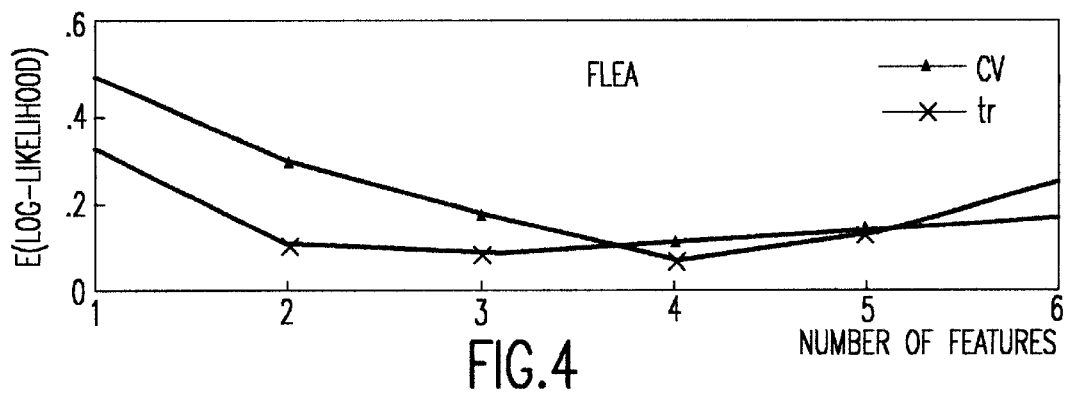
FIG. 4 is a graph of the empirical negative log-likelihood estimates for Naive Bayes models of increasing feature set cardinality obtained using penalized BIC (tr) and 10-fold cross-validation (cv) for the flea data set from Table 1.
Figure 5:
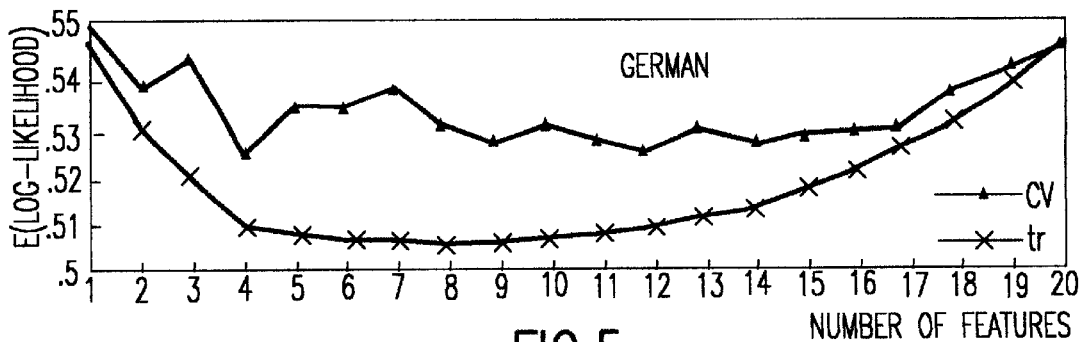
FIG. 5 is a graph of the empirical negative log-likelihood estimates for Naive Bayes models of increasing feature set cardinality obtained using penalized BIC (tr) and 10-fold cross-validation (cv) for the german data set from Table 1.
Figure 6:
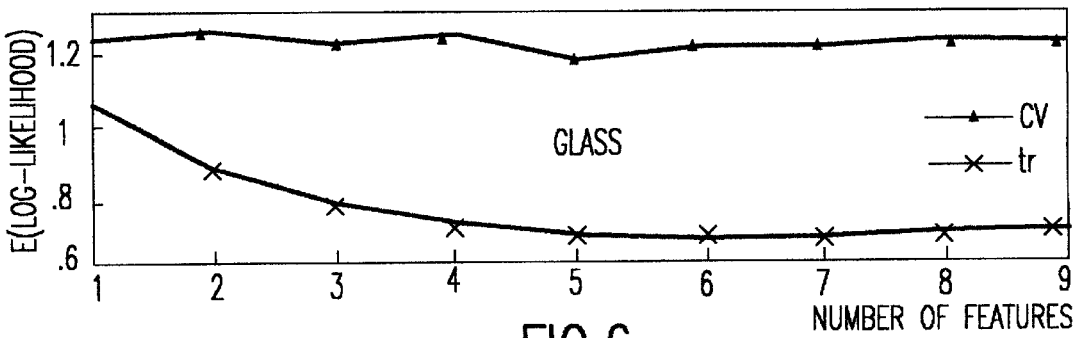
FIG. 6 is a graph of the empirical negative log-likelihood estimates for Naive Bayes models of increasing feature set cardinality obtained using penalized BIC (tr) and 10-fold cross-validation (cv) for the glass data set from Table 1.
Figure 7:
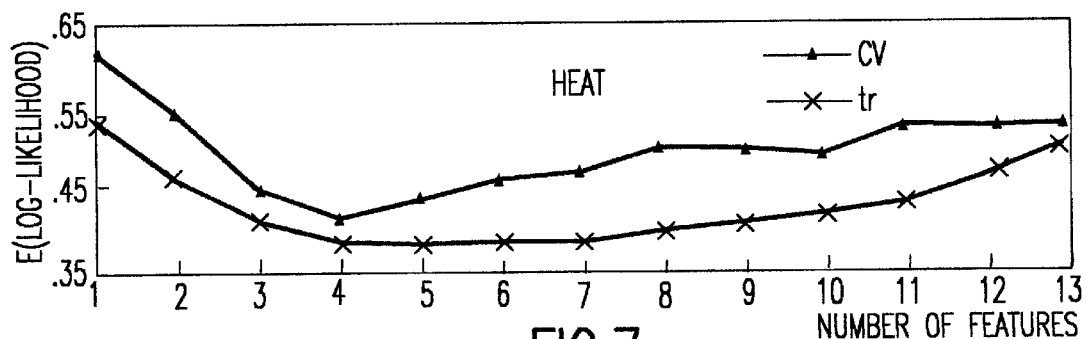
FIG. 7 is a graph of the empirical negative log-likelihood estimates for Naive Bayes models of increasing feature set cardinality obtained using penalized BIC (tr) and 10-fold cross-validation (cv) for the heart data set from Table 1.
Figure 8:
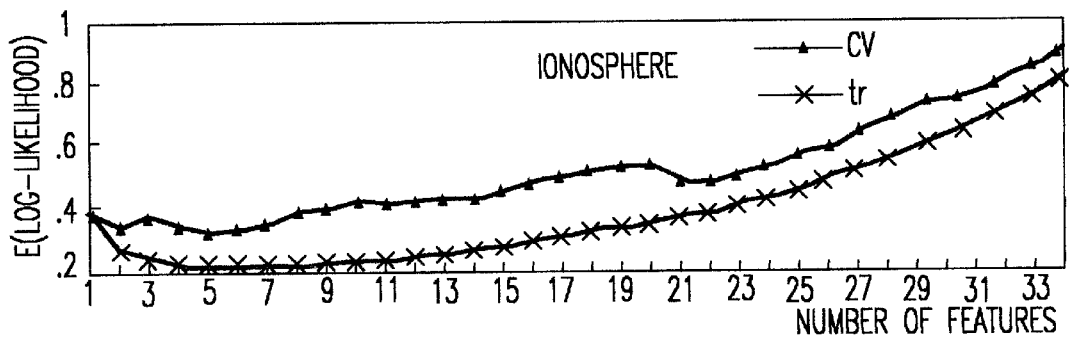
FIG. 8 is a graph of the empirical negative log-likelihood estimates for Naive Bayes models of increasing feature set cardinality obtained using penalized BIC (tr) and 10-fold cross-validation (cv) for the ionosphere data set from Table 1.
Figure 9:
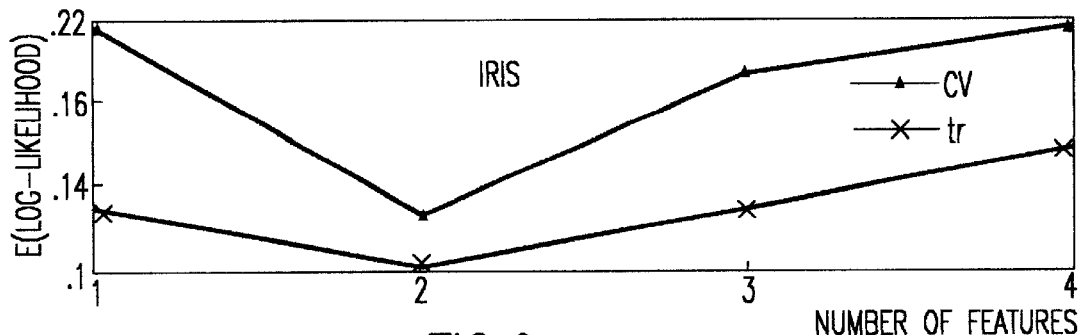
FIG. 9 is a graph of the empirical negative log-likelihood estimates for Naive Bayes models of increasing feature set cardinality obtained using penalized BIC (tr) and 10-fold cross-validation (cv) for the iris data set from Table 1.
Figure 10:
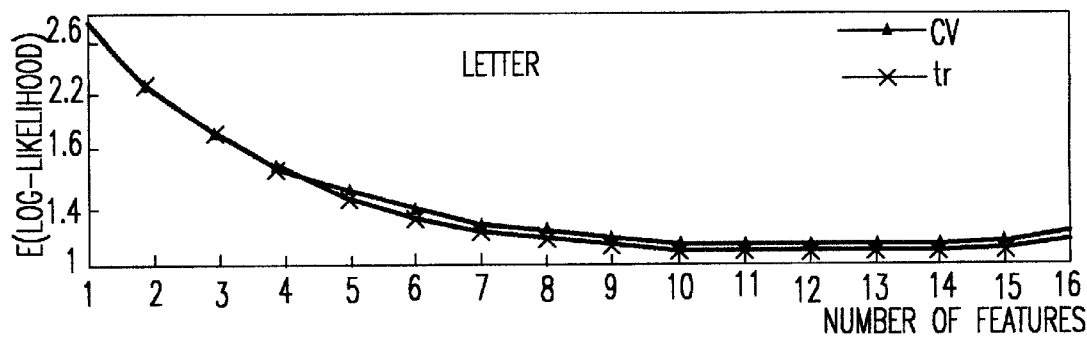
FIG. 10 is a graph of the empirical negative log-likelihood estimates for Naive Bayes models of increasing feature set cardinality obtained using penalized BIC (tr) and 10-fold cross-validation (cv) for the letter data set from Table 1.
Figure 11:
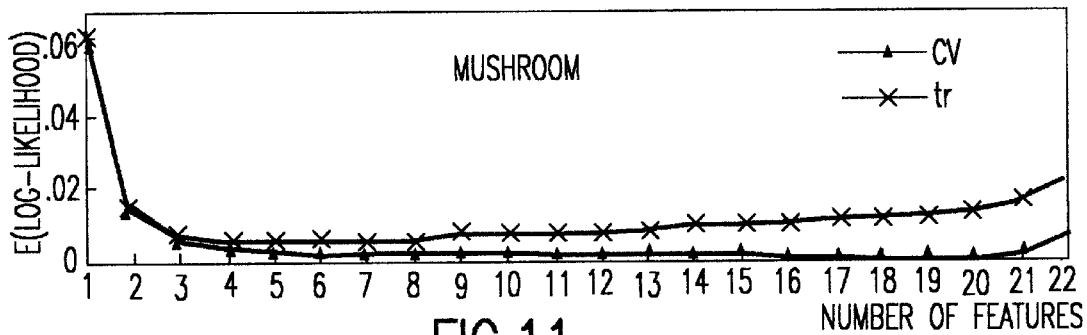
FIG. 11 is a graph of the empirical negative log-likelihood estimates for Naive Bayes models of increasing feature set cardinality obtained using penalized BIC (tr) and 10-fold cross-validation (cv) for the mushroom data set from Table 1.
Figure 12:
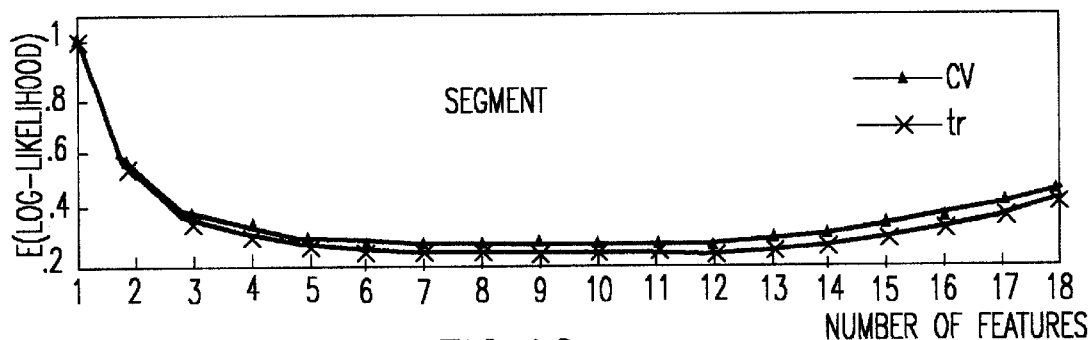
FIG. 12 is a graph of the empirical negative log-likelihood estimates for Naive Bayes models of increasing feature set cardinality obtained using penalized BIC (tr) and 10-fold cross-validation (cv) for the segment data set from Table 1.
Figure 13:
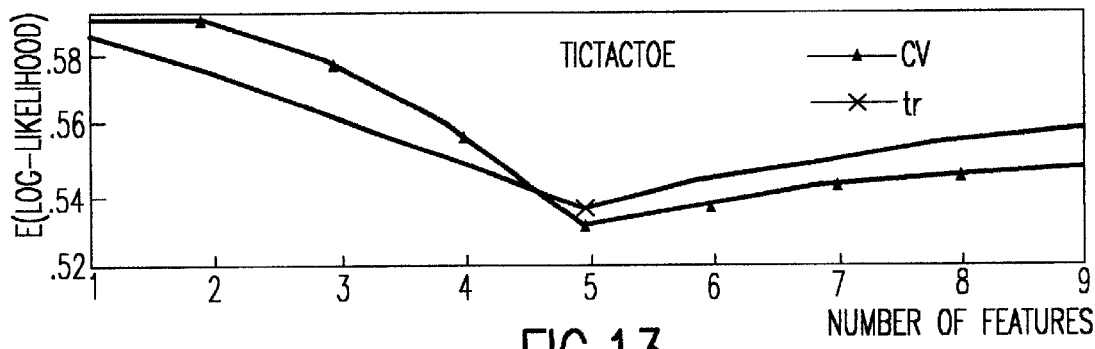
FIG. 13 is a graph of the empirical negative log-likelihood estimates for Naive Bayes models of increasing feature set cardinality obtained using penalized BIC (tr) and 10-fold cross-validation (cv) for the tictactoe data set from Table 1.
Figure 14:
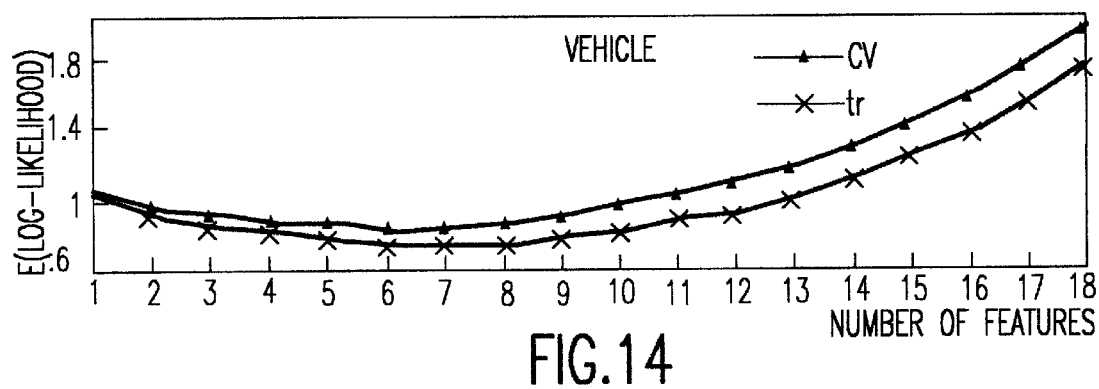
FIG. 14 is a graph of the empirical negative log-likelihood estimates for Naive Bayes models of increasing feature set cardinality obtained using penalized BIC (tr) and 10-fold cross-validation (cv) for the vehicle data set from Table 1.
Figure 15:
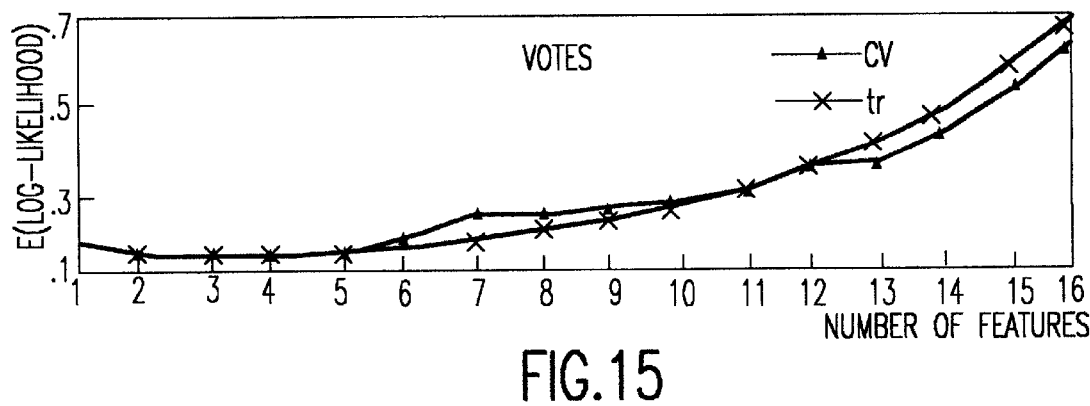
FIG. 15 is a graph of the empirical negative log-likelihood estimates for Naive Bayes models of increasing feature set cardinality obtained using penalized BIC (tr) and 10-fold cross-validation (cv) for the votes data set from Table 1.
Figure 16:
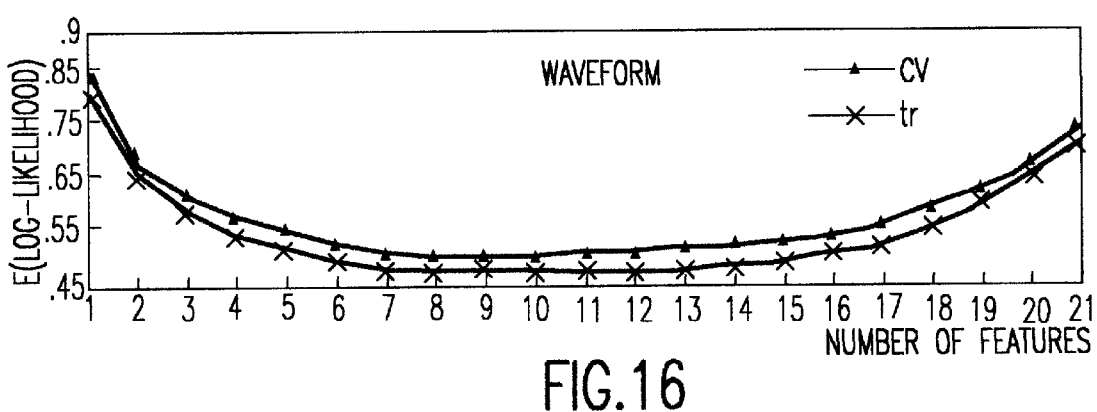
FIG. 16 is a graph of the empirical negative log-likelihood estimates for Naive Bayes models of increasing feature set cardinality obtained using penalized BIC (tr) and 10-fold cross-validation (cv) for the waveform data set from Table 1.

Let y denote the categorical response variable that takes on K values denoted by 1, 2, ..., K, respectively. Let the set of J covariate predictors for y be denoted by $X_1, X_2, \ldots, X_J$, respectively. The corresponding vector of covariates is denoted by $$X = [X_1 X_2 \ldots X_J]^T. \tag{1}$$

We now let $$\theta_k(x) = P(y=k|X), \tag{2}$$

denote the conditional probability that y takes the value k (note that $$\sum_{k=1}^{K} \theta_k(X) = 1).$$

In many cases, the objective of the predictive modeling is to classify the categorical response based on the measured covariates. The optimal Bayes classification is given by $$l(X) = \arg\max_k \theta_k(X), \tag{3}$$

The estimates $\hat{\theta}_k(X)$ for $\theta_k(X)$ in equation (3) are obtained from the training data set $\{x_i, y_i\}_{i=1}^N$ by some statistical estimation procedure (e.g., maximum likelihood). These estimates are used in equation (3) to obtain corresponding estimates $\hat{l}_k(X)$ for $l_k(X)$. Previous work (e.g., P. Domingos and M. Pazzani, "On the Optimality of the Simple Bayesian Classifier under Zero-One Loss", *Machine Learning*, Vol. 29, pp. 103–130 (1997), and J. H. Friedman, "On Bias, Variance, 0/1—loss and the Curse-of-Dimensionality", *J. Data Mining and Knowledge Discovery*, 1, pp. 55 (1997)) has shown that estimates for $\hat{l}(X)$ with low classification error rates can be obtained even if the estimates $\hat{\theta}(X)$ used in equation (3) are not very accurate. However, accurate estimates for $\theta(X)$ may be required in other applications such as targeted marketing, where the estimated probability of a customer response to a particular promotional offering is often combined with other statistical models to produce a composite score for ranking customers.

We consider the empirical expected negative log-likelihood of the N training data points $\{x_i, y_i\}_{i=1}^N$ given by $$\mathcal{L}_{TR} = -\frac{1}{N}\sum_{i+1}^{N} \log\theta_{y_i}(x_i). \tag{4}$$

The function $\mathcal{L}$ plays an essential role in predictive modeling, and most algorithms are based in one way or the other on the minimization of this function.

The feature selection problem is based on finding the optimal subset of features of cardinality $\hat{J} \leq J$ from the data, for which the corresponding model has smallest generalization error. The selection of this right-sized model is based on constructing a sequence of nested models using feature subsets of increasing cardinality (we discuss the details of how this sequence of models is constructed in the section on empirical study of feature selection, infra). The response probability estimate for the model of size j in this sequence is denoted by $\hat{\theta}_k^{(j)}(x)$. The corresponding generalization error with each model $\hat{\theta}_k^{(j)}(x)$ in this sequenced can be estimated from the empirical negative log-likelihood for a separate test data set. The generalization error with each model $\hat{\theta}_k^{(j)}(x)$ in this sequence can be estimated from the empirical negative log-likelihood for a separate test data set. This estimate is denoted by $\mathcal{L}_{TE}(\hat{\theta}_k^{(j)}(x))$ and the optimal value $\hat{J}$ is then given by denoted by $$\hat{J} = \arg\min_j \mathcal{L}_{TE}(\hat{\theta}_k^{(j)}(x)). \tag{5}$$

In many cases, there is insufficient data for an independent test data set, and an alternative estimate for the generalization error for each model size is obtained from n-fold cross-validation (where n is typically chosen to be 5 or 10). Here the original training data set is divided into n roughly-equal segments, with segment k containing $N_k$ points $$\left(\text{note that } N = \sum_{k=1}^{n} N_k\right).$$

For each k, the $N-N_k$ data points are used as training data to obtain a nested sequence of models $\hat{\theta}_k^{(k,j)}(x)$ in the usual way, and the remaining $N_k$ data points are used as test data for evaluating $\mathcal{L}_{TE}$ ($\hat{\theta}_k^{(K,j)}(x)$). This procedure is repeated for each value of k and the results are averaged to obtain the n-fold cross-validation estimate of the generalization error, which in turn yield the optimum value $\hat{J}$ as $$\hat{J} = \arg\min_j \left[\frac{1}{N} \sum_{k=1}^{n} N_i \mathcal{L}_{TE}(\hat{\theta}_K^{(k,j)}(x))\right]. \tag{6}$$

Both the test set and the cross-validation estimates of the generalization error require additional computation which may be too expensive in certain applications. In that case, a simpler approach is to obtain $\hat{J}$ from a penalized form of $\mathcal{L}_{TR}$ in the form $$\hat{J} = \arg\min_j [\mathcal{L}_{TR}(\hat{\theta}_k^{(j)}(x)) + \tfrac{1}{2}j\alpha]. \tag{7}$$

Here a penalty term involving the model complexity is used in order to avoid overfitting to the training data. A suitable value for the regularization parameter a can be specified a priori. A widely-used choice in regression problems is the Bayes information criterion $\alpha_{BIC}$=: log N, where N is the number of training data points (see G. Schwarz, "Estimating the dimension of a model", *The Annals of Statistics*, 6 (1985), pp. 461–464).

Naive Bayes Model

The conditional probability (2) can be expressed using Bayes rule as $$\theta_k(x) = \frac{\pi_k P(X=x|y=k)}{\sum_{k'=1}^{K} \pi_{k'} P(X=x|y=k')}. \tag{8}$$

The priors $\pi_k$ may either be specified extrinsically, or may be estimated using the response frequencies in the training data as $$\pi_k = \frac{N_k + \lambda_k}{N + \sum_{k'=1}^{K} \lambda_{k'}}, \tag{9}$$

where $\Sigma_k N_k = N$. The frequency counts in equation (9) have been smoothed using the parameters $\{\lambda_k\}_{k=1}^{K}$ to avoid overfitting the data for small sample sizes. The extent of smoothing is controlled by the parameters $\lambda_k$, which in the Bayesian framework may be regarded as parameters of a Dirichlet conjugate prior for the multinomial probability distribution (see A. Agresti, *Categorical Data Analysis*, John Wiley, New York (1990)). The special case of the uniform Dirichlet prior $\lambda_k=1$ in equation (9) leads to the well-known Laplace smoothing correction.

A simple and widely-used model for the covariate dependencies on $\theta_k(x)$ in equation (8) is provided by the Naive Bayes assumption, where $$P(X=x|y=k) = \Pi_{j=1}^{J} P(X_j=x_j|y=k). \tag{10}$$

This states that the covariates $\{X_j\}_{j=1}^{J}$ in X are all conditionally independent given the response y. With this assumption, the relevant conditional probabilities in equation (8) can be estimated from a set of frequency counts that can be obtained in a single training data scan.

Any continuous covariates $X_j$ can be treated in equation (10) by fitting a simple parametric or non-parametric model to the corresponding univariate marginal distributions $P(X_j=x_j|y=k)$ from the training data. The univariate Gaussian is frequently used, but more elaborate kernel density models have also been used by G. John, R. Kohavi and P. Pfleger in "Irrelevant features and the subset selection problem", *Proc. of the Eleventh International Conference on Machine Learning*, Morgan Kaufman, San Francisco (1994). In our experiments, we have uniformly pre-discretized the continuous variables and binned the values, and the implicit ordinality of the resulting derived categorical variables was ignored. C. N. Hsu, J. J. Kuang and T. T. Wong in "Why Discretization Works for Naive Bayesian Classifiers", *Proceedings of the Seventeenth International Conference on Machine Learning*, Morgan Kaufman, San Francisco, pp. 399–406 (2000), have shown that even this simple uniform discretization can be as effective as more elaborate non-uniform schemes (see, R. Kohavi and M. Sahami, "Error-Based and Entropy-Based Discretization of Continuous Features", *Proc. of the Second International Conference on Knowledge Discovery and Data Mining*, pp. 114–119 (1996)) with respect to the eventual Naive Bayes model accuracy.

We assume that the intrinsic or derived categorical feature $X_j$ takes on $M_j$ values denoted by 1, 2, . . ., $M_j$, respectively. Then, the estimate $P_{jmk}$ for $P(X_j=m|y=k)$ in equation (10) is given by $$P_{jmk} = \frac{N_{jmk} + \lambda_{jmk}}{N_k + \sum_{m'=1}^{M_j} \lambda_{jm'k}}, \tag{11}$$

where $$\sum_{m=1}^{M_j} N_{jmk} = N_k.$$

Here also, the frequency counts have been smoothed to avoid overfitted estimates for the probabilities, and the comments following equation (9) apply here as well. In particular, setting the smoothing parameters $\lambda_{jmk}=1$ corresponds to Laplace smoothing. The frequency counts in equations (9) and (11) are the sufficient statistics for estimating $\pi_k$ and $P_{jmk}$, and these can be accumulated in a single pass over the data.

The empirical negative log-likelihood for the training data is obtained from equations (8), (10) and (11) as $$\mathcal{L}_{TR} = -\underbrace{\sum_{k=1}^{K} \frac{N_k}{N}\left[\log \pi_k + \sum_{j=1}^{J}\sum_{m=1}^{M_j} \frac{N_{jmk}}{N_k} \log P_{jmk}\right]}_{A} + \tag{12}$$

$$\underbrace{\frac{1}{N}\sum_{i=1}^{N} \log\left(\sum_{k'}\left\{\prod_{j=1}^{J} P_{jx_{j,i}k'}\right\}\pi_{k'}\right)}_{B},$$

where $x_{ij}$ denotes the value of $x_j$ for the i'th training data point. Note that the term denoted by A in equation (14) can be evaluated exactly using the estimates of $\pi_k(t)$ and $P_{jmk}(t)$ from equations (9) and (11). However, the term denoted by B in (14) can only be evaluated by a separate pass over the training data, with the contribution of each data point being evaluated and summed. Similarly, the feature selection algorithm will require $\mathcal{L}_{TR}$ to be evaluated for the Naive Bayes models obtained with various subsets of features. In each such case, the corresponding A term can be evaluated exactly from the frequency counts alone; however, the evaluation of the corresponding B term requires a separate data scan.

Feature Selection

The use of feature selection in a Naive Bayes procedure can be empirically evaluated using standard data sets in the machine learning literature (see Table 1).

TABLE 1

Description of data sets obtained from (1) L. Breiman, J. Friedman, R. Olshen and C. Stone, Classification and Regression Trees, Wadsworth, Belmont CA (1984), (2) P. Brazdil and J. Gama, "Statlog project datasets", http://www.ncep.up.pt/liacc/ML/statlog, and (3) C. Blake, E. Keogh and C. Merz, "UCI repository of machine learning databases" (http://www.ics.uci.edu/mlearn). The datasets with the superscript * contain missing data records, which were removed before model building (although the modeling algorithms can handle missing values).

| Name[1] | records | features | response classes |
|---|---|---|---|
| balance[3] | 625 | 4 | 3 |
| breast (Wisconsin)[3]* | 683 | 9 | 2 |
| digit[1] | 200 | 7 | 10 |
| flea[3] | 74 | 6 | 3 |
| german[2] | 1000 | 20 | 2 |
| glass[3] | 214 | 10 | 6 |
| heart[2] | 270 | 13 | 2 |
| ionosphere[3]* | 351 | 34 | 2 |
| iris[3] | 150 | 4 | 3 |
| letter[3] | 20000 | 16 | 26 |
| mushroom[3]* | 5644 | 22 | 2 |
| segment[2] | 2310 | 19 | 7 |
| tictactoe[3] | 958 | 9 | 2 |
| vehicle[2] | 846 | 18 | 4 |
| votes[3] | 435 | 16 | 2 |
| waveform[3] | 5000 | 21 | 3 |

Table 2 shows that, with feature selection incorporated, the Naive Bayes model has lower error rates than a competing technique CART (Breiman, Friedman, Olshen and Stone, supra). The only notable exceptions are glass, tictactoe, and vehicle. Table 2 confirms that in most cases, the optimum Naive Bayes model used only a subset of the original features. Similar results have been reported by P. Langley, W. Iba and W. Thomson in "An Analysis of Bayesian Classifiers", *Proc. of the Tenth National Conference on Artificial Intelligence*, pp. 223–228, MIT Press, Cambridge, (1992) (see also P. Langley and S. Sage, "Induction of Selective Bayesian Classifiers", *Proc. of the Tenth Conference on Uncertainty in Artificial Intelligence*, Morgan Kaufmnan, San Francisco pp. 399–406 (1994)). The results in Table 2 are obtained using data sets where the features were likely to have been selected based on their predictive utility. This suggests that feature selection is likely to be even more useful in general data mining domains where the original features are not carefully chosen.

Langley, Iba, and Thomson, supra, use a greedy forward selection procedure for finding the optimum feature subset, where features are sequentially added to the model based on the maximum induced decrease in the cross-validated misclassification error. The latter quantity usually achieves a minimum for some subset of features, which then corresponds to the optimum feature subset. Their approach is somewhat different from that used in the present analysis, where in contrast the greedy forward selection procedure for adding features is based on the maximum induced decrease in $\mathcal{L}_{TR}$ in equation (12). The optimal model size is then obtained from the ten-fold cross-validation estimate of the generalization error for each model size as outlined in equation (6). This procedure was used to obtain the results in Table 2.

TABLE 2

A comparison of classification errors for CART and Naive Bayes with feature selection. The optimum CART model used the 1-SE rule. The optimum number of features in the Naive Bayes model was estimated in this case by ten-fold cross-validation. For the Naive Byes results, the continuous covariates were all discretized into eight uniform bins.

| | CART | Naive Bayes | |
|---|---|---|---|
| Name | Error Rate | Error Rate | # features selected |
| balance | 0.216 ± 0.002 | 0.083 ± 0.011 | 4/4 |
| breast (Wisconsin) | 0.053 ± 0.001 | 0.040 ± 0.007 | 4/9 |
| digit | 0.315 ± 0.033 | 0.305 ± 0.032 | 7/7 |
| flea | 0.068 ± 0.003 | 0.040 ± 0.023 | 5/6 |
| german | 0.251 ± 0.014 | 0.247 ± 0.013 | 14/20 |
| glass | 0.290 ± 0.031 | 0.364 ± 0.033 | 8/9 |
| heart | 0.219 ± 0.025 | 0.185 ± 0.024 | 10/13 |
| iris | 0.128 ± 0.017 | 0.088 ± 0.015 | 12/34 |
| letter | 0.073 ± 0.021 | 0.033 ± 0.015 | 2/4 |
| mushroom | 0.000 ± 0.000 | 0.000 ± 0.000 | 12/16 |
| segment | 0.054 ± 0.004 | 0.087 ± 0.006 | 12/22 |
| tictactoe | 0.051 ± 0.007 | 0.266 ± 0.014 | 5/9 |
| vehicle | 0.300 ± 0.016 | 0.393 ± 0.017 | 3/18 |
| votes | 0.048 ± 0.010 | 0.044 ± 0.009 | 5/16 |
| waveform | 0.231 ± 0.006 | 0.204 ± 0.0017 | 11/21 |

However, since cross-validation is expensive for large data sets, and it is of interest to see how the alternative BIC penalized-likelihood approach in equation (7) would perform. FIGS. 1 to 16 show that in practically all cases, the ten-fold cross-validation and the BIC penalized-likelihood approaches yield equivalent results for the optimum model size.

New Heuristic Using Simulated Pseudo Data

The greedy forward selection procedure using the penalized-likelihood approach described above requires $O(J^2)$ data scans with J covariate features. In each step of this greedy forward algorithm, a naive approach would use a separate data scan to evaluate $\mathcal{L}_{TR}$ for each new feature that can potentially be added to the existing feature set; therefore, since each such step requires $O(J)$ data scans, the overall method requires $O(J)$ data scans. With some careful implementation it is possible to reduce the number of data scans to $O(J)$.

However, we describe a more general technique that is based on a Monte Carlo heuristic for evaluating $\mathcal{L}_{TR}$ using which the feature selection can be performed using only two data scans, while yielding comparable results for the overall model accuracy.

This heuristic is used to estimate the term B in equation (12) using simulated pseudo-data generated from the probability models (8) and (10). Note that these probability models are completely specified from the frequency counts along with equations (9) and (11). Each sampled data point is obtained by first generating a y value from equation (9), and with this value generating all the $X_j$ values from equation (11). This procedure only requires straightforward sampling from a univariate multinomial distribution.

We consider a random sample of m pseudo-data points $\{\tilde{x}_i, \tilde{y}_i\}_{i=1}^m$, from which the term B in equation (14) can be approximated as $$B \approx \frac{1}{m}\sum_{i=1}^{m} b_i \equiv \frac{1}{m}\sum_{i=1}^{m} \log\left(\sum_{k'=1}^{K}\left\{\prod_{j=1}^{J} P_{\tilde{j}\tilde{x}_{j,i}k'}\right\}\pi_{k'}\right). \tag{13}$$

Here $b_i$ is the contribution from the corresponding pseudo-data point to the summation in relation (13) above. The resulting Monte Carlo estimate of $\mathfrak{L}_{TR}$ in equation (12), and the variance of this estimate are denoted by $\tilde{\mathfrak{L}}_m$ and $\tilde{v}_m$, respectively. As new pseudo-data points $b_m$ are generated, these estimates can $$m\tilde{\mathfrak{L}}_m = (m-1)\tilde{\mathfrak{L}}_{m-1} + b_m + A, \tag{14}$$

$$(m-1)\tilde{v}_m = (m-2)\tilde{v}_{m-1} + b_m^2 + (m-1)\tilde{\mathfrak{L}}_{m-1} - m\tilde{\mathfrak{L}}_m - 2(m-1)\tilde{\mathfrak{L}}_{m-1}A +$$
$$2m\tilde{\mathfrak{L}}_m A - A^2 \tag{15}$$

For large m, the Monte Carlo estimate for $\mathfrak{L}_{TR}$ is given by $\tilde{\mathfrak{L}}_m \pm \sqrt{\tilde{v}_m}$, where the bounds represent the one-standard error confidence interval (J. M. Hammersley and D. C. Handscomb, *Monte Carlo Methods*, John Wiley, New York (1964)) on the asymptotic value. Given the inherent approximation in replacing $\mathfrak{L}_{TR}$ by a simulated value, it seems excessive to obtain a very tight estimate for $\mathfrak{L}_{TR}$ in our experiments, we have simply used m=N pseudo-data points, since that is the number of data points in the actual training data.

However, the possibility is that small number of m<<N pseudo-data points might suffice is of interest, since this would make this procedure far less expensive than the input/output (I/O) cost of a separate training data scan. Furthermore, these m pseudo-data points are generated by sampling a probability distribution fitted to the entire training data. Hence, the resulting estimates will have less sampling variability than an equivalent set of m data points sampled uniformly directly from the training data.

The overall feature selection procedure using this heuristic can be implemented as follows. In the first data scan, the frequency counts in equations (8) and (11) are collected. Then, the Monte Carlo heuristic equation (14) is used to obtain estimates for $\mathfrak{L}_{TR}$ that are required in the usual greedy forward selection algorithm leading to a sequence of nested models, as described above. A second data scan is then carried out in which $\mathfrak{L}_{TR}$ is evaluated exactly using equation (12) for each model in this sequence. Finally the BIC penalized-likelihood criterion (7) is used to identify the optimal model size as above.

The results using this heuristic approach often yield the same results for the optimum model size as the more exact approach used for the results in Table 2. Surprisingly, for some data sets, e.g., digit, the Monte Carlo heuristic gives the same estimates for $\mathfrak{L}_{TR}$ as the exact evaluation. However, even when the two estimates differ, it is often the case that the sequence in which features are added in the greedy forward selection is quite similar. This is particularly true when the number of features is less that the eventual optimum number of features, as ascertained from the second training data scan. This may be explained by the fact that the estimated values of $\mathfrak{L}_{TR}$ tend to level off as conditionally correlated features are introduced into the Naive Bayes model as covariates. This is also precisely the point at which the training data, which contains these conditionally corre-lated features displays properties that cannot be obtained from the simulated pseudo data of the generative Naive Bayes probability model, however large the simulation sample size. Then the values of $\mathfrak{L}_{TR}$ in equation (14) cannot be reliably estimated from the Monte Carlo pseudo data in that case, but since this divergence occurs only beyond the value of the optimum model size, the subsequent ordering of the features produced by the heuristic is not important.

Implementation

The scale-up of statistical modeling algorithms to massive data sets is of great interest to the data mining community, and several recent studies have focused on various aspects of this problem. For example, G. Graefe, U. Fayyad and S. Chaudhuri, "On the Efficient Gathering of Sufficient Statistics for Classification from Large SQL Databases", *Proc. of the Fourth International Conference on Knowledge Discovery and Data Mining*, pp. 204–208, (1998), and A. W. Moore and M. S. Lee, "Cached Sufficient Statistics for Efficient Machine Learning with Large Datasets", *Journal of Artificial Intelligence Research*, p. 8 (1998), describe efficient methods for evaluating sufficient statistics for statistical modeling algorithms, which allows the modeling computations to be carried without having to refer back to the original data. These approaches work only if the statistical modeling algorithm to be used is fixed in advance and if the models can be computed from a finite set of sufficient statistics from the data.

Other approaches to this problem include P. S. Bradley, U. Fayyad and C. Reina, "Scaling Clustering Algorithms to Large Databases", *Proc. of the Fourth International Conference on Knowledge Discovery and Data Mining*, pp. 9–15, (1998), and W. DuMouchel, C. Volinsky, T.Johnson, C. Cortes and D. Pregibon, "Squashing Flat Files Flatter", *Proc. of the Fifth International Conference on Knowledge Discovery and Data Mining*, pp. 6–157 (1999), who describe methods for producing compressed data sets consisting of a small number of pseudo data points and associated weights, which is then used for the statistical modeling. However, this approach requires that the underlying statistical modeling procedure and computer implementation be capable of handling weights, which can be a limitation.

Figure 17:
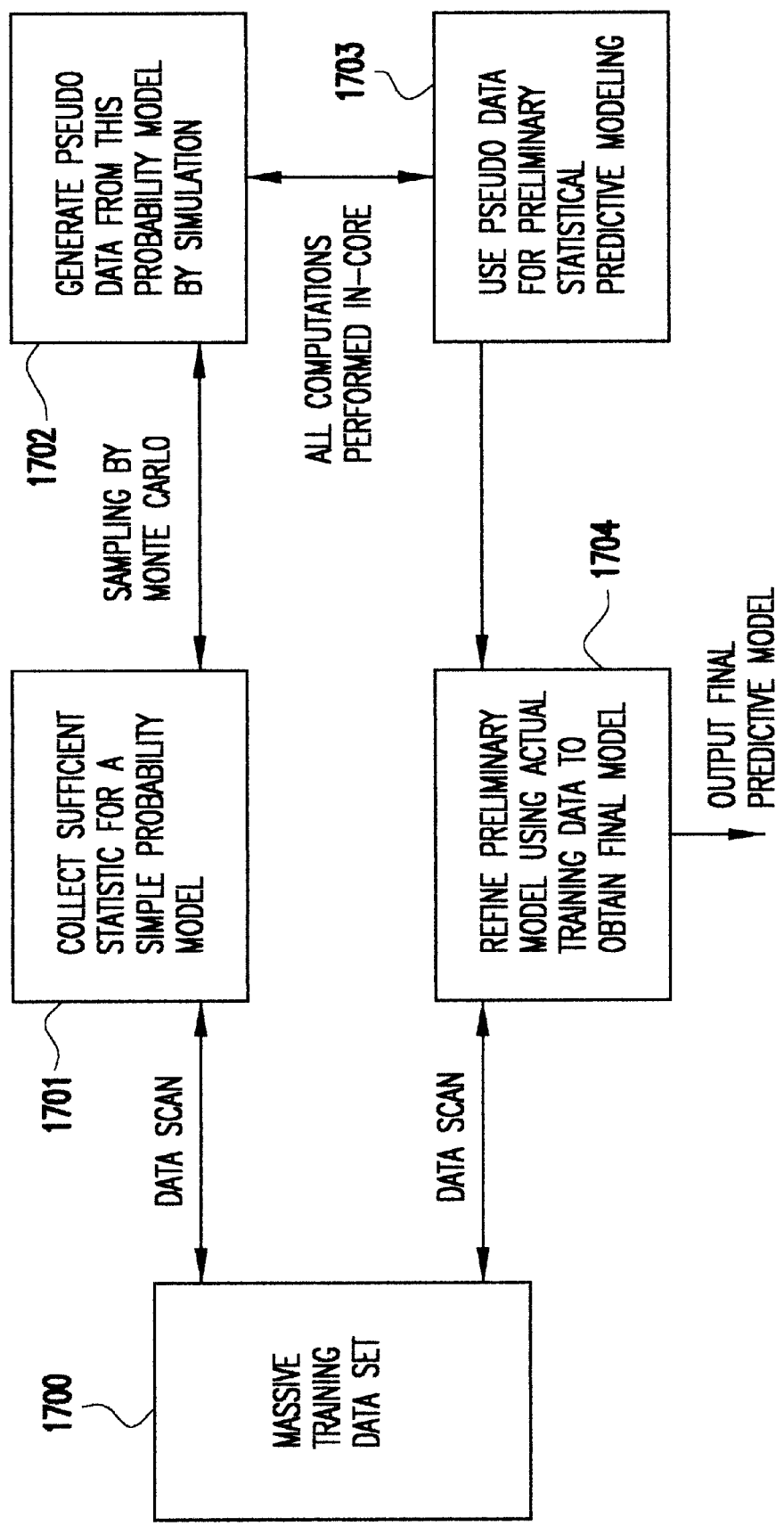
FIG. 17 is a block diagram showing the predictive modeling from massive data sets as implemented by the present invention.

Our approach, which is illustrated in the block diagram of FIG. 17, differs from previous art in that a simple probabilistic model is constructed for which sufficient statistical data can be easily obtained from the massive training data set. This model is then used to generate simulated pseudo data as required that can be used for some parts of the overall statistical modeling procedure. In particular, this approach can be used for preliminary model selection or model parameter estimation. The preliminary model can then be refined in a final step by reverting to the original data.

In FIG. 17, the massive training data set 1700 is accessed and a data scan is performed to collect sufficient statistical data for a simple probability model in 1701. Monte Carlo sampling is next performed to generate pseudo data from the probability model by simulation in 1702. The thus generated pseudo data is used for preliminary statistical predictive modeling in 1703. A further data scan of the massive training data set 1700 is made to refine the preliminary model using acutal training data to obtain a final model in 1704.

Figure 18:
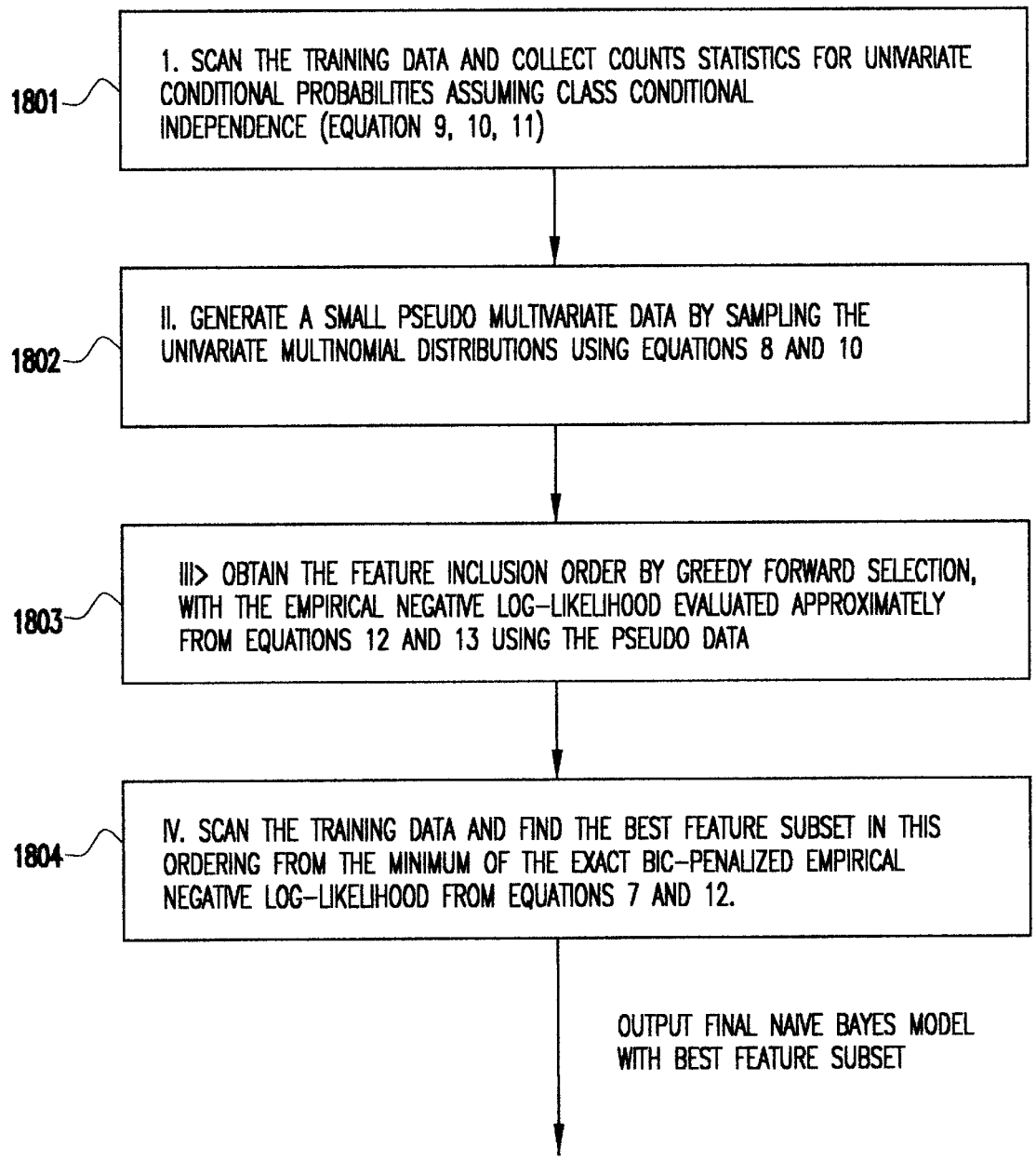
FIG. 18 is a block diagram showing the Naive Bayes with feature selection algorithm as implemented by the present invention.

FIG. 18 shows the process of the Naive Bayes feature selection modeling from massive data sets as implemented by the present invention. The first step in block 1801 is to scan the training data and collect counts statistics for univariate conditional probabilities assuming class conditional independence. This is done using equations (9), (10) and (11). The next step in block 1802 is to generate a small pseudo multivariate data by sampling the univariate multinomial distributions using equations (8) and (10). In the third step in block 1803 we obtain the feature inclusion order by greedy forward selection, with the empirical negative log-likelihood evaluated approximately from equations (12) and (13) using the pseudo data. In the final step in block 1804, the training data is scanned to find the best feature subset in this ordering from the minimum of the exact BIC-penalized empirical negative log-likelihood from equations (7) and (12). The output of this process is the final Naive Bayes model with the best feature subset.

This particularized implementation of this procedure is described for the Naive Bayes model with feature selection. Here the usual algorithm would have required numerous training data scans, but using this heuristic it was possible to obtain results of comparable accuracy with only two data scans.

While the invention has been described in terms of a single preferred embodiment, those skilled in the art will recognize that the invention can be practiced with modification within the spirit and scope of the appended claims.

Having thus described our invention, what we claim as new and desire to secure by letters patent is as follows:

1. A method for constructing statistical predictive models from massive training data sets in a computationally efficient way, the method comprising the steps of:

(a) constructing a simple probability model for which the sufficient statistics can be obtained from a single scan of the training data;

(b) using simulated pseudo data from this simple probability model for some aspects of the overall statistical predictive modeling procedure; and (c) finally refining the overall -statistical predictive model by reverting to the original training data, so that the final model is obtained with only a few extra data scans.

2. A method for constructing statistical predictive models from massive training data sets as recited in claim 1, wherein this computational methodology is used to compute a Naive Bayes model with feature selection in only two data scans, compared to $O(J^2)$ data scans which would otherwise be required (J being the number of features in the model), the method further comprising of the steps of:

(a) carrying out a single pass over the data to collect the counts statistics in the training data for the number of occurrences of each feature category given the response category (yielding sufficient statistical data for the univariate multinomial distribution of the conditional feature probability given the response category);

(b) constructing a simple multivariate probability model that assumes the features to be conditionally independent given the response category, which is then fully specified from the univariate multinomial conditional distributions in the previous step;

(c) carrying out a greedy-forward feature selection algorithm with an approximate likelihood function computed using the pseudo data that is simulated from the multivariate probability model in the previous step; and (d) finally, having determined the order in which features are introduced into the model, reverting to a single scan of the original data to evaluate the BIC penalized likelihood for each sequence of models in this order, and selecting the best model.

3. The method for constructing statistical predictive models from massive training data sets as recited in claim 1, wherein this computational methodology is used to compute a Naive Bayes model with feature selection in only two data scans, compared to $O(J^2)$ data scans which would be required by a straightforward implementation (J being the number of features in the model), the method further comprising the steps of:

(a) in a first training data scan, collecting sufficient statistics for a simple probability model by
      (i) collecting counts statistics for a number of occurrences of each response category and the number of occurrences of each feature category given the response category, and
      (ii) using the collected counts statistics to estimate response priors and a univariate multinomial distribution for conditional feature probability given a response category;

(b) generating a set of pseudo data points from this simple probability model by Monte Carlo sampling by
      (i) sampling the generated multinomial distribution to obtain a pseudo response k,
      (ii) given k, sampling from the generated multinomial distributions to obtain pseudo covariates and using an independence assumption to obtain a pseudo data point, and
      (iii) repeating steps (b)(i) and (b)(ii) to obtain a set of pseudo data points;

(c) using a greedy-forward feature selection algorithm using the pseudo data
      (i) starting with an empty feature set, finding a feature whose introduction into the model leads to the maximum decrease in the likelihood function,
      (ii) adding this feature to the feature set, and
      (iii) repeating steps (c)(i) and (c)(ii) until all features have been sequentially added; and (d) performing a final training data scan and determining a best feature subset by
      (i) for each sequence of models in the feature ordering, evaluating the BIC-penalized log-likelihood with the contribution of each data point in an empirical negative log-likelihood being summed as training data is scanned, and
      (ii) identifying a feature subset that yields a minimum BIC-penalized log-likelihood to provide an optimal feature subset.

4. The method for constructing statistical predictive models from massive training data sets as recited in claim 3, wherein in step (a)(i), the number of occurrences of each response category is $N_k$ and the priors $\pi_k$ are estimated using the response frequencies in the training data as $$\pi_k = \frac{N_k + \lambda_k}{N + \sum_{k'=1}^{K} \lambda_{k'}},$$

where $\Sigma_k N_k = N$ and $\lambda_k$ are smoothing parameters, and the conditional probability that feature j takes the value m given the response category k is given by $$P_{jmk} = \frac{N_{jmk} + \lambda_{jmk}}{N_k + \sum_{m'=1}^{M_j} \lambda_{jm'k}},$$

where $$\sum_{m=1}^{M_j} N_{jmk} = N_k$$

and $N_{jmk}$ is the number of occurrences with the feature j has value m, and the response has value k.

5. The method for constructing statistical predictive models from massive training data sets as recited in claim 4, wherein the independence assumption in step (b)(ii) is given by $P(X=x|y=k)=\Pi_{j=1}^{J} P(X_j=x_j|y=k)$, which states that the covariates $\{X_j\}_{j=1}^{J}$ in X are all conditionally independent given a response y.

6. The method for constructing statistical predictive models from massive training data sets as recited in claim 5, wherein in step (c)(i) the maximum likelihood function is defined by $$\mathcal{L}_{TR} = -\underbrace{\sum_{k=1}^{K} \frac{N_k}{N} \left[ \log \pi_k + \sum_{j=1}^{J} \sum_{m=1}^{M_j} \frac{N_{jmk}}{N_k} \log P_{jmk} \right]}_{A}$$

$$= +\underbrace{\frac{1}{N} \sum_{i=1}^{N} \log \left( \sum_{k'} \left\{ \prod_{j=1}^{J} P_{jx_{j,i}k'} \right\} \pi_{k'} \right)}_{B},$$

where $x_{j,i}$ denotes the value of $x_j$ for the i'th training data point, but with B approximated by $$B \approx \frac{1}{m} \sum_{i=1}^{m} b_i \equiv \frac{1}{m} \sum_{i=1}^{m} \log \left( \sum_{k'=1}^{K} \left\{ \prod_{j=1}^{J} P_{j\tilde{x}_{j,i}k'} \right\} \pi_{k'} \right),$$

$\tilde{x}_{j,i}$ is the value of the i'th pseudo data point.

7. The method for constructing statistical predictive models from massive training data sets as recited in claim 6, wherein in step (d)(i) the BIC-penalized log-likelihood is evaluated exactly using $\hat{J}$ from a penalized form of $\mathcal{L}_{TR}$ in the form $$\hat{J} = arg\ min_j [\mathcal{L}_{TR}(\hat{\theta}_k^{(j)}(x) + \tfrac{1}{2} j\alpha].$$

* * * * *